United States Patent
Neuhoff et al.

(10) Patent No.: US 9,659,798 B2
(45) Date of Patent: *May 23, 2017

(54) SYSTEM AND METHOD FOR PRODUCING DEVICES INCLUDING A SEMICONDUCTOR PART AND A NON-SEMICONDUCTOR PART

(75) Inventors: Oskar Neuhoff, Nittendorf (DE);
Tobias Gamon, Warstein (DE);
Norbert Martin Haueis, Lappersdorf (DE); Dirk Pikorz, Warstein (DE);
Michael Wolfgang Larisch, Regensburg (DE); Franz Reithner, Heimberg (DE)

(73) Assignee: Infineon Technologies AG, Neubiberg (DE)

( * ) Notice: Subject to any disclaimer, the term of this patent is extended or adjusted under 35 U.S.C. 154(b) by 609 days.

This patent is subject to a terminal disclaimer.

(21) Appl. No.: 13/558,299

(22) Filed: Jul. 25, 2012

(65) Prior Publication Data
US 2012/0284977 A1 Nov. 15, 2012

Related U.S. Application Data

(63) Continuation of application No. 13/010,998, filed on Jan. 21, 2011, now Pat. No. 8,309,465.

(51) Int. Cl.
*H01L 21/306* (2006.01)
*C23F 1/00* (2006.01)
(Continued)

(52) U.S. Cl.
CPC .... *H01L 21/67207* (2013.01); *H01L 21/6715* (2013.01); *H01L 21/6719* (2013.01); *H01L 21/67126* (2013.01); *H01L 21/67173* (2013.01); *H01L 21/67253* (2013.01); *H01L 21/67288* (2013.01); *H01L 21/68707* (2013.01); *H01L 21/68728* (2013.01); *H01L 24/72* (2013.01); *H01L 24/90* (2013.01); *H01L 22/12* (2013.01); *H01L 2924/01004* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01042* (2013.01);

(Continued)

(58) Field of Classification Search
CPC ........ H01L 21/31116; H01L 21/67069; H01L 21/67028; H01L 21/67167; B24B 37/013; B24B 49/12; C23F 1/08; H01J 37/32935
USPC .......... 438/689, 694, 706, 716; 134/1.2, 1.3; 216/2, 13; 414/217, 222.01; 156/345, 156/345.12, 345.13, 345.32
See application file for complete search history.

(56) References Cited

U.S. PATENT DOCUMENTS 7,651,306 B2    1/2010  Rice et al.
8,309,465 B2 *  11/2012 Neuhoff et al. .............. 438/689
(Continued)

*Primary Examiner* — Hsien Ming Lee
(74) *Attorney, Agent, or Firm* — Slater Matsil, LLP

(57) ABSTRACT

A system produces devices that include a semiconductor part and a non-semiconductor part. A front end is configured to receive a semiconductor part and to process the semiconductor part. A back end is configured to receive the processed semiconductor part and to assemble the processed semiconductor part and a non-semiconductor part into a device. A transfer device is configured to automatically handle the semiconductor part in the front end and to automatically transfer the processed semiconductor part to the back end.

22 Claims, 13 Drawing Sheets

(51) Int. Cl.
*B65H 1/00* (2006.01)
*H01L 21/311* (2006.01)
*H01L 21/67* (2006.01)
*H01L 21/687* (2006.01)
*H01L 23/00* (2006.01)
*H01L 21/66* (2006.01)

(52) U.S. Cl.
CPC ............... *H01L 2924/01068* (2013.01); *H01L 2924/10253* (2013.01); *Y10T 29/41* (2015.01); *Y10T 29/53022* (2015.01); *Y10T 29/53187* (2015.01)

(56) References Cited

U.S. PATENT DOCUMENTS

| | | |
|---|---|---|
| 2005/0064703 A1 | 3/2005 | Kondo et al. |
| 2006/0056952 A1 | 3/2006 | Haris |
| 2008/0011332 A1 | 1/2008 | Bailey et al. |
| 2008/0278188 A1* | 11/2008 | Chung .......................... 324/762 |

* cited by examiner

STEP 1

STEP 2

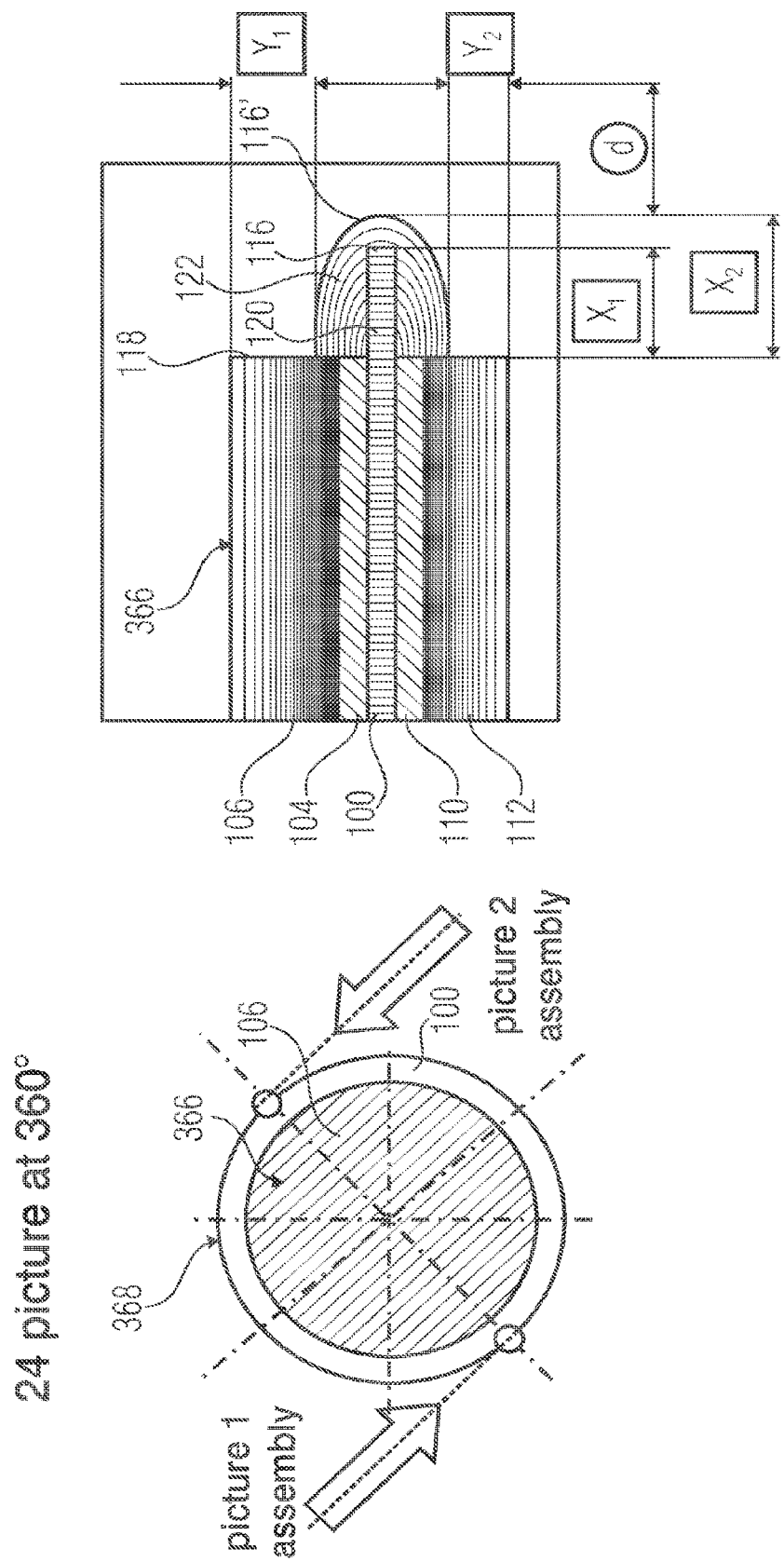

SYSTEM AND METHOD FOR PRODUCING DEVICES INCLUDING A SEMICONDUCTOR PART AND A NON-SEMICONDUCTOR PART

This is a continuation application of U.S. application Ser. No. 13/010,998, entitled "System and Method for Producing Devices Including a Semiconductor Part and a Non-Semiconductor Part," which was filed on Jan. 21, 2011 and is incorporated herein by reference

TECHNICAL FIELD

Embodiments of the invention relate to a system and to a method for producing devices including a semiconductor part and a non-semiconductor part.

BACKGROUND

Conventional processes for manufacturing a device including a semiconductor part and a non-semiconductor part comprise, for example, processes for producing power disc devices. Such power disc devices, also known as STD pellets, are formed of a stack of a plurality of discs comprising a silicon disc sandwiched between pairs of copper and molybdenum discs. The silicon disc has its outer edges beveled, and the planar main surfaces thereof may be covered with an Al metallization. Conventional processes for generating such a device comprise a manual workplace for etching the silicon disc at its periphery, a manual workplace for assembly of the discs of silicon, copper and molybdenum into a stack, and a manual workplace for providing a passivation of the exposed edge of the silicon disc extending beyond the copper and molybdenum discs. Further, manual processes for inspection are provided and the respective elements are handled manually between the respective workplaces.

SUMMARY OF THE INVENTION

Embodiments of the invention provide a system for producing devices including a semiconductor part and a non-semiconductor part, the system comprising:
a front end configured to receive a semiconductor part and to process the semiconductor part;
a back end configured to receive the processed semiconductor part and to assemble the processed semiconductor part and a non-semiconductor part into a device; and a transfer device configured to automatically handle the semiconductor part in the front end and to automatically transfer the processed semiconductor part to the back end.

Embodiments of the invention provide a system for producing a power disc device comprising a semiconductor disc sandwiched between a plurality of metal discs, the system comprising:
a front end semiconductor processing station comprising a plurality of etching stations and a test station, the etching station being configured to etch an edge of a semiconductor disc, and the test station being configured to test the etched semiconductor disc;
a back end device assembly station comprising: an assembly station configured to assemble the etched semiconductor disc and a plurality of metal discs into a stack, wherein the semiconductor disc has a larger diameter than the metal discs,
a passivation station configured to apply a passivation material to the edge of the stack to cover the exposed area of the semiconductor disc, and
a heating station configured to receive the passivated stack and to heat the stack; and
a robot comprising an arm provided with a gripper and configured to handle the semiconductor disc in the front end semiconductor processing station and to transfer the etched semiconductor disc from the front end semiconductor processing station to the back end device assembly station.

Embodiments of the invention provide a system for producing devices including a semiconductor part and a non-semiconductor part, the system comprising:
a front end receiving a semiconductor part and processing the semiconductor part;
a back end receiving the processed semiconductor part and the non-semiconductor part and assembling the parts into a device; and
means for automatically handling the semiconductor part in the front end and for automatically transferring the processed semiconductor part to the back end.

Embodiments of the invention provide a method for producing devices including a semiconductor part and a non-semiconductor part, the method comprising:
receiving and processing at a front end processing station a semiconductor part;
receiving and assembling at a back end processing station the processed semiconductor part and a non-semiconductor part; and
automatically handling the semiconductor part in the front end processing station and automatically transferring the processed semiconductor part to the back end processing station by a transfer device.

BRIEF DESCRIPTION OF THE DRAWINGS

FIG. 1 shows an example of a power device, wherein FIG. 1A is an isometric, exploded view of the different discs used, and FIG. 1B is a cross-sectional representation of the device;

FIG. 4 shows an example of the robots used in the back end cluster, wherein FIG. 4A shows a first robot, and wherein

FIG. 5 shows details of the assembly station depicted in FIG. 3, wherein FIG. 5A shows an isometric view of the assembly station, wherein FIG. 5B shows an enlarged view of a reception area of the assembly station, wherein FIG. 5C shows a bracket of a centering device in a position centering a lower metal disc, and wherein

FIG. 10A shows the positions at which the pictures are taken by the monitoring systems of FIG. 9;

FIG. 10B shows the passivated stack and the dimensions measured by the monitoring system;

FIG. 11 shows the heating station, wherein FIG. 11A shows the heating station comprising the plurality of heating devices, wherein FIG. 11B shows one heating device in its open state, and wherein

DETAILED DESCRIPTION OF ILLUSTRATIVE EMBODIMENTS

The semiconductor industry is typically embedded in Frontend and Backend (FE and BE) production. Quality management between FE and BE is a challenge and mainly based on people's knowledge and behavior. For reducing maintenance costs, stop lost production, eradicate unplanned outages and equipment breakdowns, the handling steps need to be improved, e.g., manual handling steps need to be eliminated, especially manual chip (wafer) transportation after chip test.

For example, known processes for producing power disc devices are manual processes including the beveling process of the semiconductor disc used in the device either chemically by etching or mechanically. Also the assembly and the passivation processes are manual processes. Therefore, the current process for generating such devices is slow, inaccurate, inefficient and prone to producing rejects due to the manual work involved.

Thus, a need exists for an approach allowing the production of such devices with a high volume and a high quality.

Embodiments of the invention provide a highly automated assembly/passivation process integrated into an advanced design of an etching cluster which allows for a reduction of process steps thereby realizing stable processing to increase productivity. In accordance with a first aspect of the invention, a front end cluster and a back end cluster for the manufacturing process of the disc devices are integrated or linked. In accordance with a second aspect, an advanced assembly station is provided. In accordance with a third aspect of the invention, an advanced passivation station is provided. In accordance with a fourth aspect of the invention, a dynamic process control system controlling the assembly and passivation of the power disc devices is provided. In accordance with a fifth aspect, an advanced preheating station is provided. Embodiments of the invention provide for a quality improvement by providing a fully automated etch and passivation technology and due to an intermediate chip transportation using a robot system.

Embodiments of the invention will now be described with regard to a system or process for producing disc-shaped power devices in the form of a plurality of metal discs and a silicon disc assembled to a stack.

Figure 1:
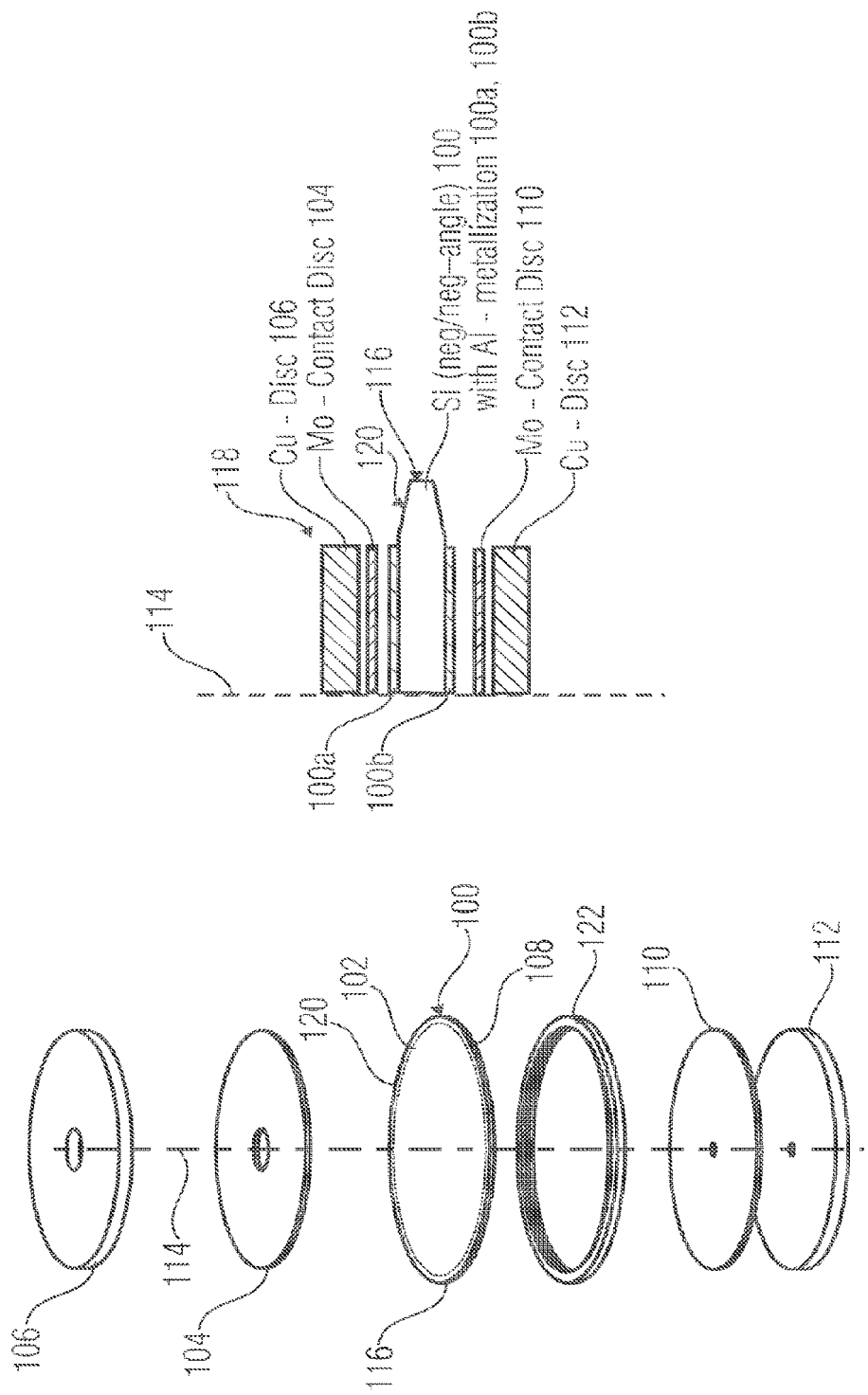

FIG. 1 shows an example of such a power device, wherein FIG. 1A is an isometric, exploded view of the different discs used, and FIG. 1B is a schematic cross-sectional representation of the device. The device comprises a silicon disc 100 sandwiched between metal discs. More specifically, on an upper surface 102 of the silicon disc, a molybdenum disc 104 is provided on top of which a copper disc 106 is arranged. On a lower surface 108 of the silicon disc 100 a further molybdenum disc 110 is arranged below which a further copper disc 112 is provided. The respective discs 100 to 112 are stacked on top of each other in a way as shown in FIG. 1A and are centered with respect to a central axis 114. As is shown in FIG. 1B, the silicon disc 100 may be provided with an aluminum metallization 100a and 100b. The silicon disc 100 has a larger diameter than the remaining discs so that an outer edge 116 of the silicon disc 100 extends radially further outward than an outer edge 118 of the remaining discs 104, 106, 110 and 112. The part 120 of the silicon disc 100 extending beyond the edge 118 is beveled so that the cross-sectional shape of portion 120 is tapered. The thickness of the disc portion 120 is reduced from a thickness at a center 114 towards the outer edge 116 of the disc 100. The portion 120 is the exposed edge region of the silicon disc, i.e., the portion not covered by the other discs. Inside the silicon disc two pn junctions are provided, one close to the upper surface 102 and one close to the lower surface 108. To provide for a sufficiently long electrical path along the upper and lower surface and around the edge 116 the tapered structure of the edge portion 120 is used.

For processing or manufacturing a device having a structure as shown in FIG. 1, a front end process cluster (e.g., a spin-etch cluster) is provided. In the front end process cluster the silicon disc 100 is processed or treated for shaping the portion 120 of the disc in a way shown in FIG. 1B. A back end cluster or assembly cluster is provided for joining the disc 100 with the molybdenum and copper discs to form a stack. Since the edge portion 120 of the silicon disc 100 has been etched, i.e. thinned, it is very sensitive and should not be contacted during the handling. In addition the edge portion 120 extends beyond the edge 118 of the other discs in the stack. Therefore, after assembling the respective discs to a stack a passivation 122 is applied so as to cover the exposed area 120 of the silicon chip 100. Following the passivation, the stack is preheated and then forwarded to further processing. After the preheating step, the stack with the passivation has a sufficient stability and can be easily handled.

Embodiments of the first aspect of the invention will now be described. In accordance with the first aspect of the invention the front end or spin-etch cluster and the back end cluster or assembly cluster are linked.

Figure 2:
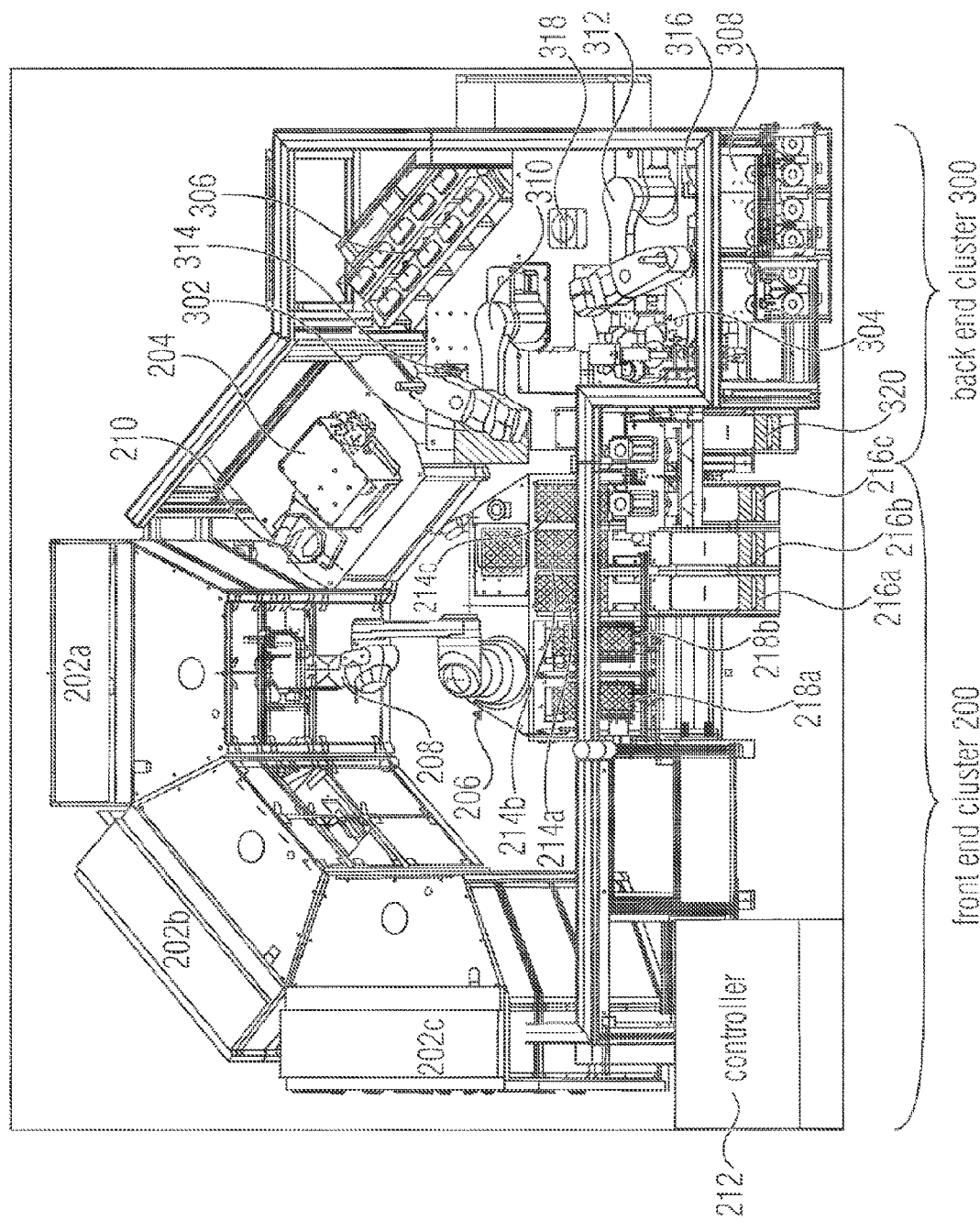
FIG. 2 shows an overview of the system including the linked front end and back end equipment.

FIG. 2 shows an overview of the system including the linked front end and back end equipment. As mentioned above, the front end equipment is used for handling and treating (processing) the semiconductor disc 100 (see FIG. 1). The front end cluster 200 comprises three etch modules 202a to 202c each including an etch chamber for receiving a single disc 100. Inside the etch chamber, the disc is received and rotated. During rotation an etching liquid is sprayed onto the edge portion 120 of the disc 100 for obtaining the tapered structure discussed above. The front end further comprises a test station 204. The test station 204 receives an etched or treated silicon disc and determines whether the silicon disc has predefined electrical characteristics and also whether the desired degree of etching at the portion 120 was achieved. The front end cluster 200 further comprises a robot 206 comprising an arm 208 being provided with a gripper (not shown) and being rotatable around six axes. The robot arm 208 is provided for handling the silicon discs inside the front end cluster 200, more specifically for inserting the non-treated discs into the respective etch stations 202a to 202c and into the test station 204. The front end further comprises a control element 210 for optically controlling a silicon disc held by the robot arm 208. The robot arm 208 holding a disc moves into the control device 210 and by an optical inspection it is determined whether the disc has a predefined shape and structure or whether any defects are present so that the disc may be rejected. In addition, the position of the disc in the gripper with respect to the robot arm 208 is determined, so that on the basis of this information the robot 206 can be controlled by the controller 212 to insert the disc into the etch stations 202a to 202c and inside the test station 204 at the correct position. For example, in case the silicon disc is not exactly centered with regard to the gripper by means of the control device 210 this "mispositioning" is detected so that the robot 206 is controlled to make an additional movement to ensure that the disc is correctly placed, for example, on the spinning table inside the etch station.

The front end 200 further comprises a plurality of inputs 214a to 214c each receiving an input tray provided in respective magazines 216a to 216c. In addition, the front end 200 comprises reject outputs 218a and 218b. The inputs and outputs 214 and 218 receive respective trays that are adapted to hold a plurality of silicon discs. The robot 206 is controlled by means of the controller 212 to take from one of the input trays provided at the inputs 214a to 214c an untreated semiconductor disc, to check its structure and its position in the control device 210 and to input it into one of the etch stations 202a to 202c. In case it is determined that the silicon disc 100 is defective, rather than inputting it into one of the etch stations the robot 206 is controlled to place this defective silicon disc in one of the trays provided in the reject outputs 218a and 218b. Also, in case the test station 204 yields a test result for a processed silicon disc 100 indicating that a test failed, i.e., that the silicon disc being etched was not valid, by means of the robot 206 this disc will be placed in the reject output 218a or 218b. It may also be that the test station 204 indicates that the etching was not sufficient, and in such a situation, instead of placing the silicon disc into one of the reject bins, it is again introduced into an etch station which is controlled to provide for an additional etching that was determined, for example, with regard to the duration, on the basis of the results from the test station. In case the silicon disc after this additional etch test passes the test, it can be further processed.

FIG. 2 further shows the back end cluster 300 used for assembling the power disc devices. The back end cluster 300 comprises an intermediate tray 302 positioned at the interface between the front end cluster 200 and the back end cluster 300. The back end cluster 300 comprises an assembly station and a passivation station that is commonly indicated in FIG. 2 by reference sign 304. The back end cluster 300 further comprises a heating station 306 comprising a plurality of individual heating entities. The back end cluster 300 further comprises a plurality of input magazines 308 for providing the metal discs, namely the copper discs and the molybdenum discs. The back end cluster 300 comprises two robots 310 and 312, wherein the robot 310 is provided for taking from the intermediate tray 302 a processed or treated silicon disc received from the front end cluster 200 and to forward it to the assembly/passivation station 304. In a similar way as in the front end cluster 200, also in the back end cluster 300 a control device 314 is provided for optically determining a position of the treated silicon device held by the robot 310 for allowing a correct placement thereof in the assembly station 304. The position of the disc held by the robot 310 is determined with respect to the structure of the robot so that the robot can be controlled accordingly to place the disc at a desired position. The robot 310 is further provided for transferring a passivated stack from the passivation station 304 to the heating station 306, again via a control device 318 for controlling the passivated stack and its position. The robot 310 also obtains the preheated devices or pellets from the heating device 306 and provides them in an output tray 320 from which the processed devices can be forwarded to further processing stations. The robot 312 is provided for obtaining from the input 308 the respective molybdenum and copper discs and for placing them in the assembly station 304. A control device 316 is provided for inspecting the discs received from the input 308 to ensure that no defects are present in the discs and that also to determine a position thereof with respect to the robot 312.

In accordance with embodiments of the first aspect of the invention, FIG. 2 shows a system in which the front end cluster 200 and the back end cluster 300 are linked via the robot 206 provided in the front end cluster 200. The robot 206 transfers silicon devices from the test station 204, in case they passed the test, to the intermediate tray 302, from which they can be transferred into the assembly station by means of the robot 310.

Thus, in accordance with the first aspect of the invention, the drawbacks of conventional processes are avoided, as all processing steps are automated, especially the transfer between the front end cluster 200 and the back end cluster 300, thereby avoiding any manual handling and contact with a device until it has a sufficiently stable structure after the heating in the heating station 306.

The integrated system linking the front end cluster 200 and the back end cluster 300 in the above described way overcomes the problems described above and associated with the manual processing, especially the manual transfer between the front end and the back end. Linking the front end and back end clusters as described in accordance with embodiments of the invention provides an advanced equipment integration technology to avoid damages on a chip during transportation after wafer test. In accordance with embodiments, one or more video cameras, one or more vision systems and a plurality of integrated sensors are used for providing real time feed back to a technician and maintenance for troubleshooting and predictive maintenance.

In the embodiment described with regard to FIG. 2, a robot 206 was provided for allowing handling of the semiconductor discs in the front end and for transferring the semiconductor discs after treatment to the back end cluster 300. It is noted that the inventive approach is not limited to this implementation of the link between the front end cluster and the back end cluster, rather instead of the robot 206 any kind of transfer device allowing handling the discs inside the front end and transferring the discs from the front end to the back end is possible.

For example, the means for automatically handling the semiconductor part in the front end and for automatically transferring the processed semiconductor part to the back end or the transfer device configured to automatically handle the semiconductor part in the front end and to automatically transfer the processed semiconductor part to the back end may comprise a carrousel having one or more portions for receiving the semiconductor part. The one or more portions pass the respective stations in the front end (e.g., the one or more etch stations, the one or more control stations and the one or more test stations as well as the one or more input ports and reject ports). In addition, the front end, the back end and the carrousel are arranged such that the intermediate tray is passed for transferring the processed semiconductor element from the front end to the back end. The carrousel may be provided with a charger/de-charger element for transferring the semiconductor between the respective stations and the portion on the carrousel. The carrousel may comprise one or more charger/decharger elements for servicing the one or more portions. Alternatively, respective charger/decharger elements may be provided at the respective stations in the front end and at the intermediate tray.

In accordance with other embodiments, a conveyor may be provided for implementing the transfer device or the means for transferring. For example, a belt conveyor may be provided which extends such that is passes the respective stations in the front end (see, e.g., above) and the intermediate tray between the front end and the back end. The semiconductor elements may be provided on the conveyor directly or may be arranged on/in a transport pod moving along the conveyor. Again, respective charger/decharger elements may be provided.

In yet another embodiment, the transfer device or the means for transferring may be implemented using a self-propelled, automatically controlled carriage that receives one or more semiconductor elements or one or more transport pods and that is controlled to move to the respective stations in the front end and to the intermediate tray. Again, respective charger/decharger elements may be provided.

In the following, further aspects of the invention will be described which are a part of the back end cluster 300.

Figure 3:
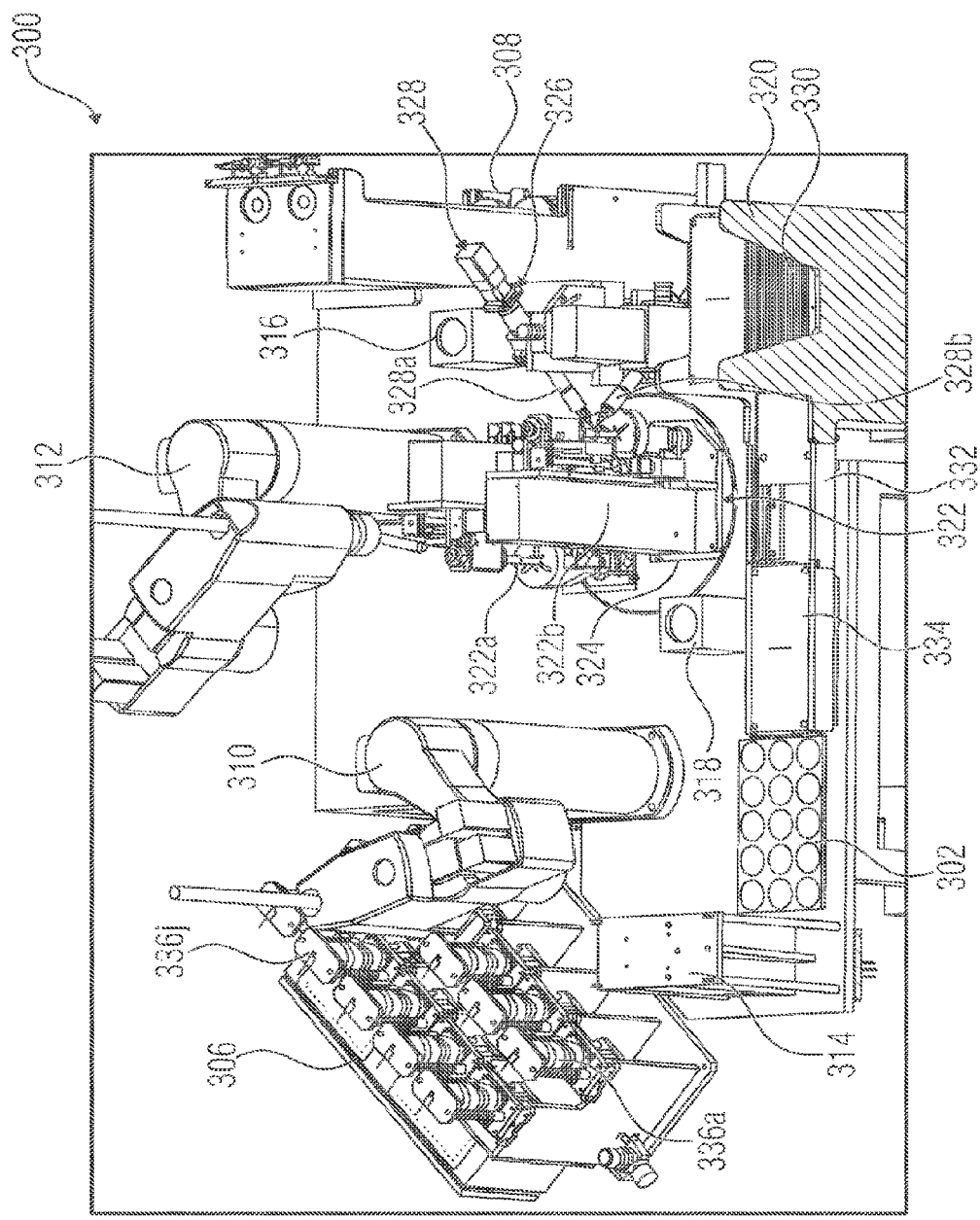
FIG. 3 is an enlarged view of the back end cluster described with regard to FIG. 2.

FIG. 3 is an enlarged view of the back end cluster 300 already described with regard to FIG. 2. FIG. 3 is a view from the interface between the front end cluster 200 and the back end cluster 300. The assembly/passivation station 304 comprises an assembly block 322 comprising two assembly stations 322a and 322b. The assembly stations 322a and 322b are provided on a rotatable table 324 so that the station 322a can be rotated from the position shown in FIG. 3 to the position at which station 322b in FIG. 3 is. Likewise, by rotating the table 324 the station 322b can be moved from the position shown in FIG. 3 to the position of station 322a. Further, the back end cluster 300 comprises a passivation station 326 comprising a nozzle device 328 comprising a top nozzle 328a and a bottom nozzle 328b for providing the passivation material at the edge of the silicon disc on its upper and lower surfaces and on the outer edge.

In FIG. 3 the assembly station 322a is at the position where the respective discs, the silicon disc and the copper and molybdenum discs, are put on top of each other. After the stacking is completing a clamping force is applied and the stack is raised. The table 324 is then turned so that the assembly station is at the position of assembly station 322b and the stack is raised in such a way that the edge of the silicon disc is between the upper and lower nozzles 328a and 328b. The assembly stations 322a and 322b allow a rotation of the stack while maintaining the clamping pressure, thereby allowing the application of the passivation material by means of the nozzle 328a to 328b around the entire periphery.

The heating station 306 comprises a plurality of individual heating devices 336a to 336j, which can be selectively activated dependent on the throughput of devices in the system.

The output 320 of the back end cluster 300 comprises an output tray magazine 330 receiving a plurality of trays holding already completed devices. A transport system 332 is provided for placing an output tray 334 at a station where, by means of the robot 310 completed devices can be transferred from the heating station 306 to the tray 334. Once the tray 334 is filled it is moved into the magazine 320 and a new, empty tray is provided.

Figure 4A:
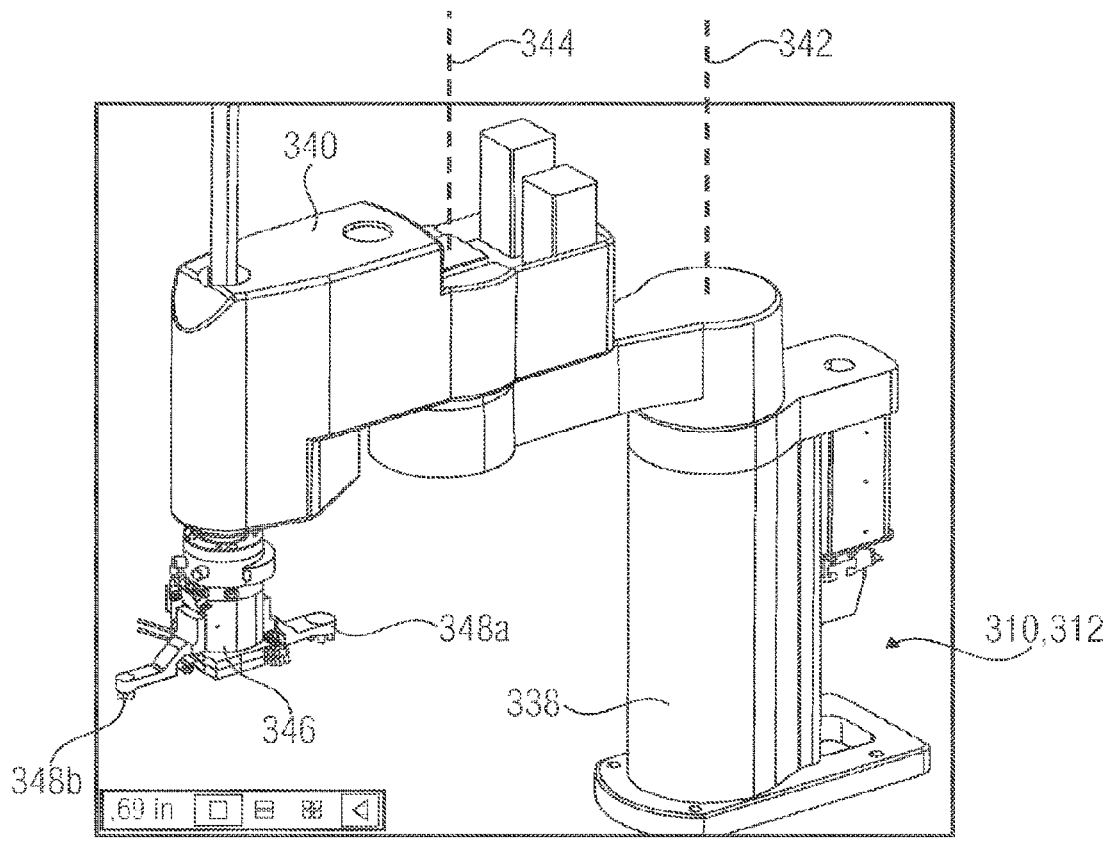
Figure 4B:
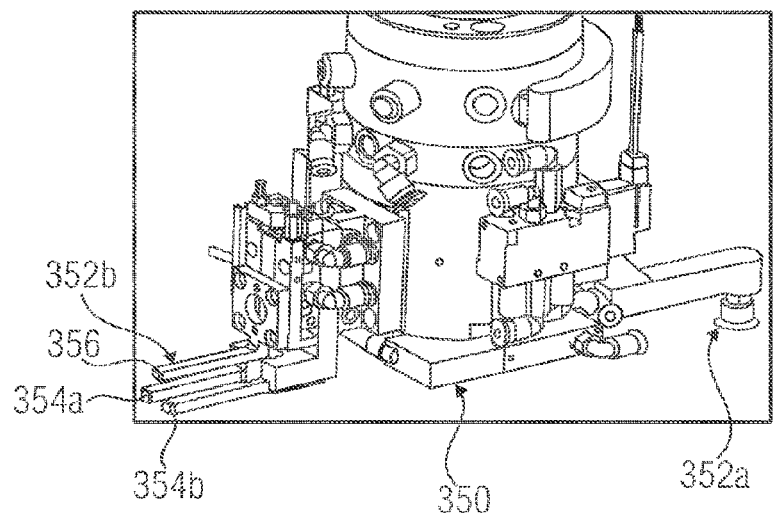
FIG. 4B shows the gripper of a second robot.

FIG. 4 shows an example of the robots 310, 312 used in the back end cluster 300 in accordance with embodiments of the invention. FIG. 4A shows the robot 312 comprising a stand 338 to which an arm 340 is rotatably mounted. The arm 340 can be rotated about two parallel axis, namely axis 342 and 344 and at a forward end of the arm a gripper 346 is attached. The robot 312 comprises a gripper 346 having two suction elements 348a and 348b that are used for gripping and placing the copper and molybdenum discs from the input 308 into the assembly station 322a. Dependent on the size of the discs to be handled, either gripper element 348a or gripper element 348b is used. The structure of the robot 310 is basically the same as that of robot 312 except that the gripper is different. FIG. 4B shows the gripper 350 of the robot 310 comprising a first gripper element 352a and a second gripper element 352b. The gripper element 352a is a suction element that is used for taking a processed silicon disc from the intermediate tray 302 and for placing it via the control device 314 into the assembly station 322a. Once the passivation process is completed, the passivated stack which is still clamped by the assembly station returns to position 322a. For removing the passivated stack from the assembly station the gripper 352b is used. Other than gripper 352a having the suction head depicted in FIG. 4B, the gripper element 352b comprises two lower bars 354a and 354b and one upper bar 356. The upper and lower bars are moveable with respect to each other. In the embodiment of FIG. 4B the upper bar 356 is moveable in a vertical direction, thereby allowing to apply a clamping force to an element held between the bars 354a, 354b and 356. The clamping structure of the assembly stations 322a and 322b is configured in such a way that the upper bar 356 of gripper 352b passes through a hole in an upper stamp and the lower bars 354a and 354b receive a lower stamp there between. The bars are moved with respect to each other to apply a clamping force to the passivated stack and only once a clamping force starts to be applied to the passivated stack the clamping elements of the assembly station 322a will be removed. Thus, when transferring the passivated stack using the robot 310 the gripper mechanism 352b ensures that a continuous clamp force is applied to the stack.

The individual heating devices 336a to 336j of the heating station 306 are provided with two heating brackets that can be vertically moved with respect to each other. These heating brackets are configured in such a way that when placing a passivated stack by means of the gripper arm 352b into one of the heating devices the brackets are closed and apply a pressure to the passivated stack. Only once the brackets are closed and begin to start applying a pressure the bars 354a, 354b and 356 of the gripper 352b release the clamping force and are finally removed from the heating station.

In the following, further details of embodiments of the second aspect of the invention will be described. In accordance with the second aspect of the invention an advanced assembly station is provided and embodiments thereof will now be described with reference to FIG. 5.

Figure 5A:
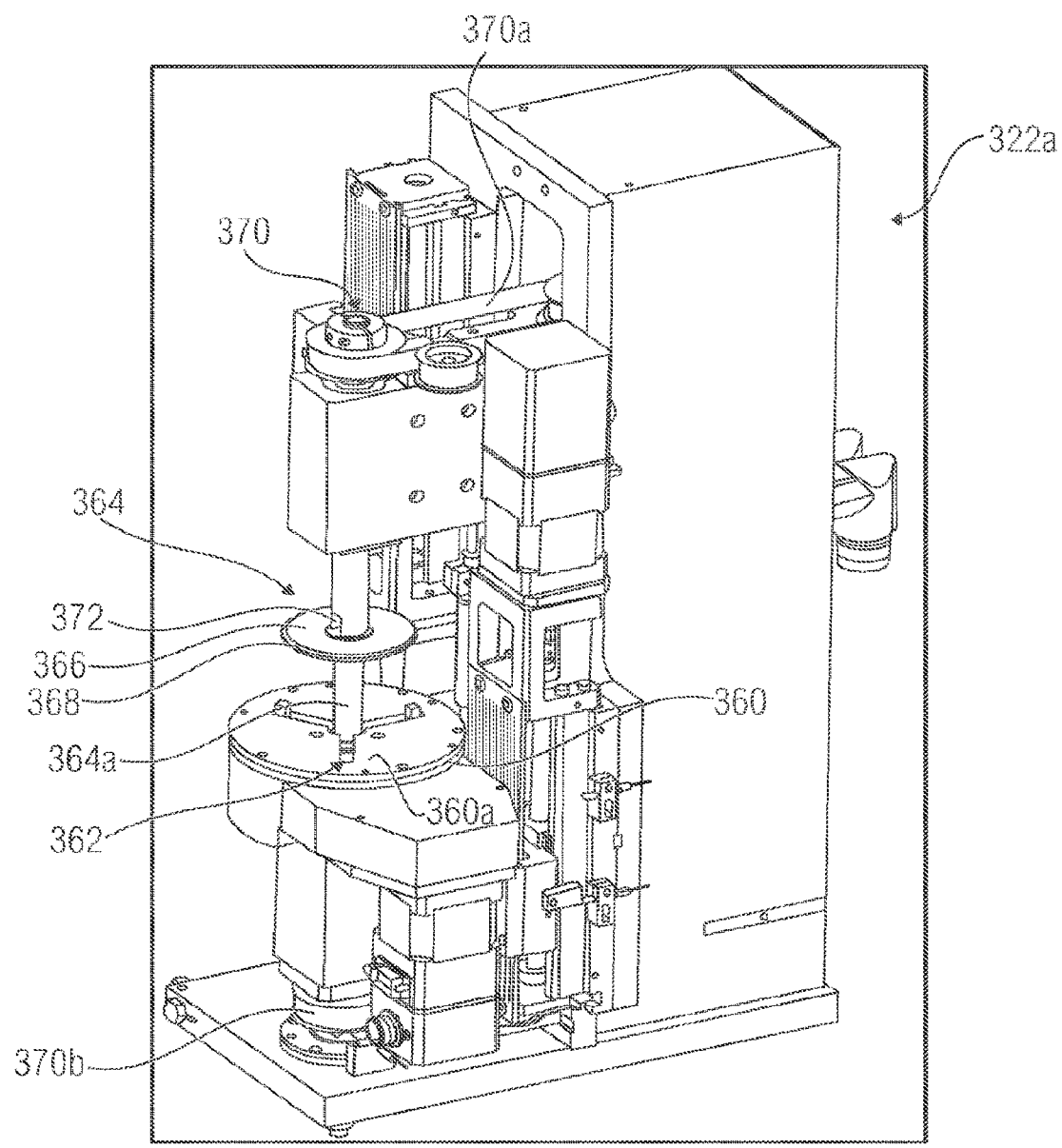

FIG. 5A shows an isometric view of an example of the assembly station 322a also shown in FIG. 3. The assembly station 322a comprises a reception area 360 at which the respective discs to be assembled into a stack are received. The assembly station 322a comprises a centering device 362 and a clamping device 364. The clamping device 364 comprises a lower stamp 364a and an upper stamp 364b. The stamps 364a and 364b are moveable in a vertical direction and with respect to each other. More specifically, the lower stamp 364a is moveable from a lower position in which its upper surface is substantially flush with a surface 360a of the reception area to an extended position as shown in FIG. 5A. The upper stamp 364b is also moveable in a vertical direction. More specifically, it is moveable from a retracted position downward to contact an upper surface of the stack. The two stamps are moved vertically in such a way that a desired clamping force is applied to the stack. The two stamps 364a and 364b are controlled to be moved vertically upward for providing the stack that is shown in FIG. 5(a) at reference sign 366 at a position elevated above the reception area 360. This allows the two nozzles of the passivation station (see FIG. 3) to apply the passivation material from above and from below to the edge 368 of the stack 366. The assembly station 322a further comprises a drive 370 comprising belts 370a and 370b for rotating the stamps 364a and 364b, thereby allowing a rotation of the stacks 366 clamped there between. The upper stamp 364b comprises an opening 372 so that the lower end of the upper stamp 364b is fork-shaped. The opening 372 is provided for receiving the upper bar 356 of the gripper 350 of the robot 310. The lower stamp 364a has a smaller diameter than the upper stamp 364b and its diameter is selected such that the lower stamp 364a can be received between the two lower bars 354a and 354b of the gripper 350 of the robot 310.

Figure 5B:
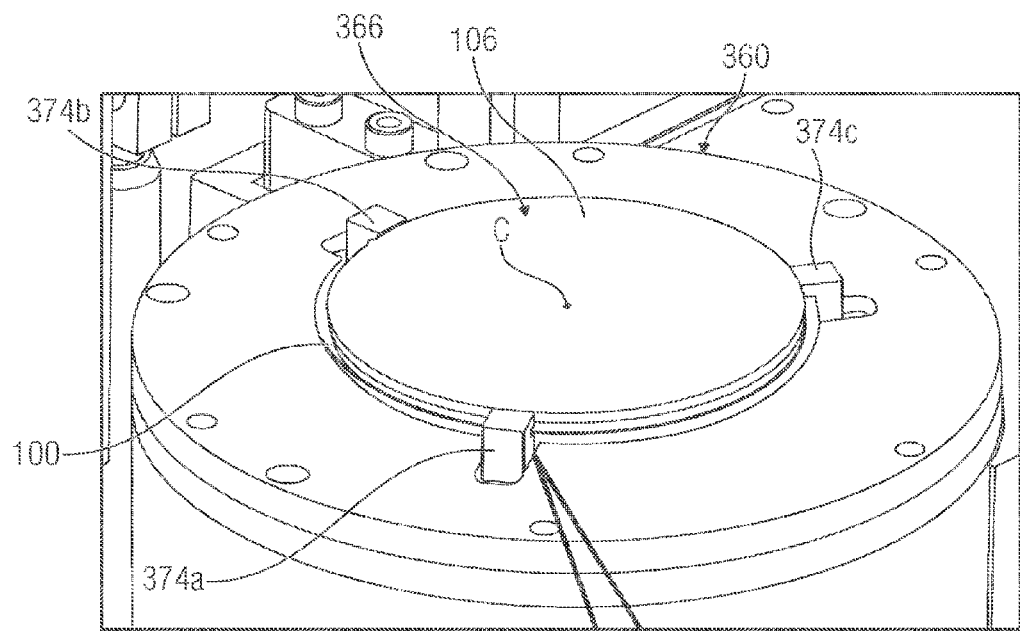
Figure 5C:
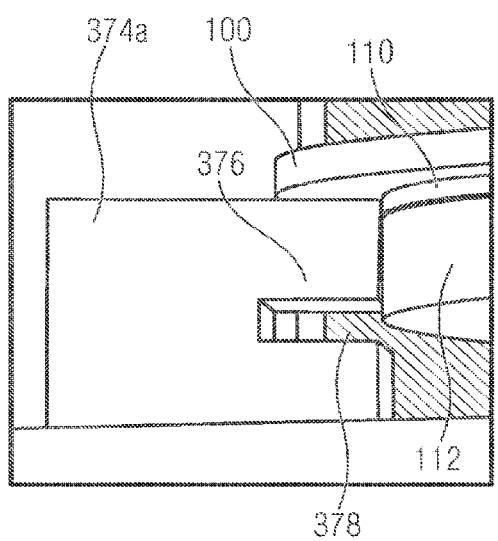
Figure 5D:
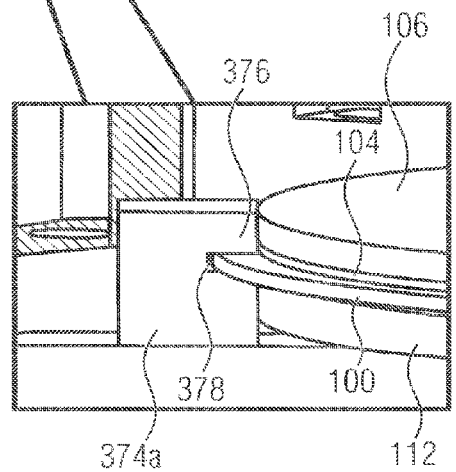
FIG. 5D shows a bracket of a centering device in a position centering an upper metal disc.

FIG. 5B shows an enlarged view of the reception area 360 of the assembly station 322a. The centering device 362 comprises three brackets 374a to 374c which are arranged at equal distances or intervals around a central part of the reception area 360 where the respective discs are received. The brackets 374a-374c are moveable in a radial direction inwardly and outwardly with respect to a center of the reception area 360 and vertically upwards and downwards. For producing the stack, in a first step depicted in FIG. 5C the lower copper disc 112 and the lower molybdenum disc 110 are placed on the reception area 360. When placing the discs onto the reception area 360 the brackets 374a are in their radially retracted position. Once the discs 110 and 112 are placed, the three brackets are moved radially inward so that a forward part 376 of the brackets 374a-374c contacts the two discs. Due to the arrangement of the three brackets, the radial inward movement thereof results in a centering of the discs with regards to the center C of the desired stack. Subsequently, the silicon disc 100 is placed onto the layers 110 and 112. As mentioned above, the position of the disc 100 with regard to the gripping device is determined by the control devices provided in the back end cluster 300 so that the robot 210 can be controlled on the basis of this position information in such a way that the disc 100 is also centered. An active centering of the disc using the brackets is not possible as any contact with the etched peripheral portion of the silicon disc would damage the disc which needs to be avoided. Following the placement of the silicon disc the upper molybdenum layer 104 and the upper copper layer 106 are placed on top of the disc 100. The brackets 374 are radially retracted by a distance so that the part 376 of the brackets 374 can pass the outer edge of the silicon disc 100 when the brackets are moved vertically upward. Once the part 376 clears the disc 100 a radially inward movement of the brackets occurs thereby centering the discs 104 and 106 in the same way as the lower discs 112 and 110. In the embodiment shown in FIG. 5, the brackets 374 are provided with a slit 378 receiving the outer edge of the silicon disc 100 when the bracket is at the position shown in FIG. 5D. However, other embodiments may provide for a bracket comprising only the extension 376 extending from the main body of the bracket 374 without the material below the slit 378.

Once all of the discs are centered, the brackets 374 are retracted, and the stamps 364a and 364b are activated for clamping the stack 366 and holding it at a position shown in FIG. 5A.

Figure 6:
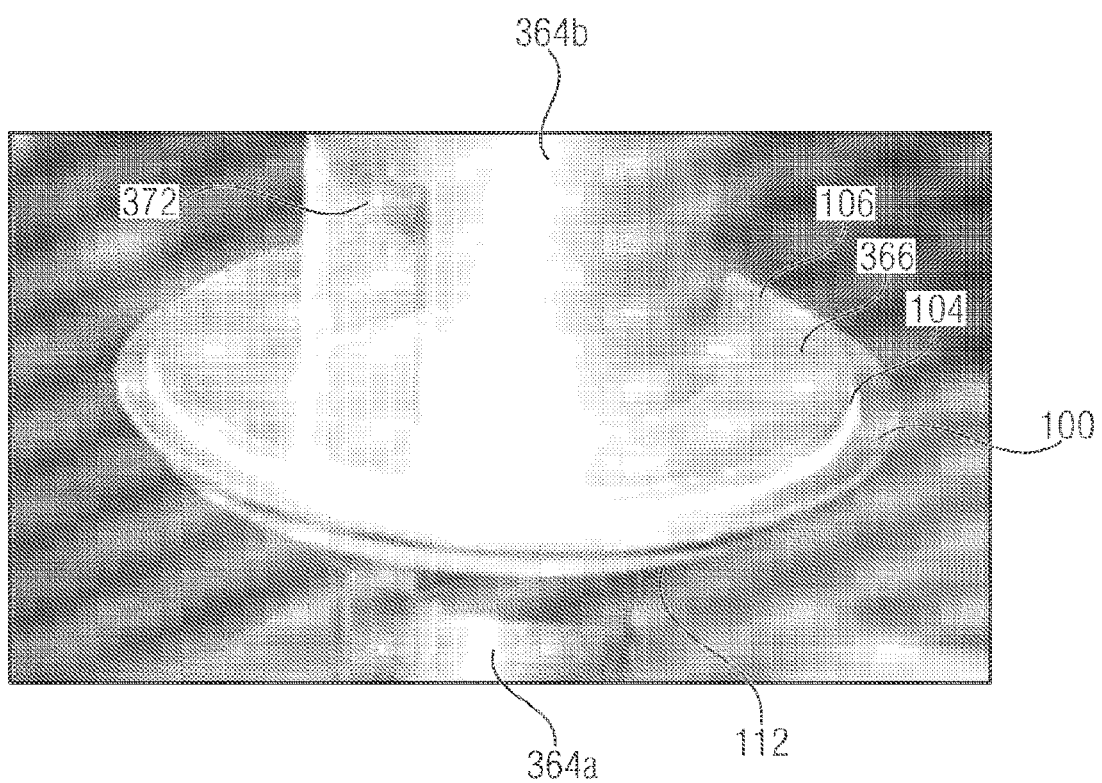
FIG. 6 is a photographic representation of a stack of silicon, copper, and molybdenum discs.

FIG. 6 is a photographic representation showing the stack 366 comprising the disc 100, the copper disc 106, the molybdenum disc 104 as well as the lower molybdenum disc 110 and lower copper disc 112 clamped between the upper stamp 364b and the lower stamp 364a of the assembly 322a. Also, the opening 372 in the upper stamp 364b can be seen in FIG. 6.

In the following, further details of embodiments of the third aspect of the invention will be described. In accordance with the third aspect of the invention an advanced passivation station is provided and embodiments thereof will now be described with reference to FIG. 7.

Figure 7:
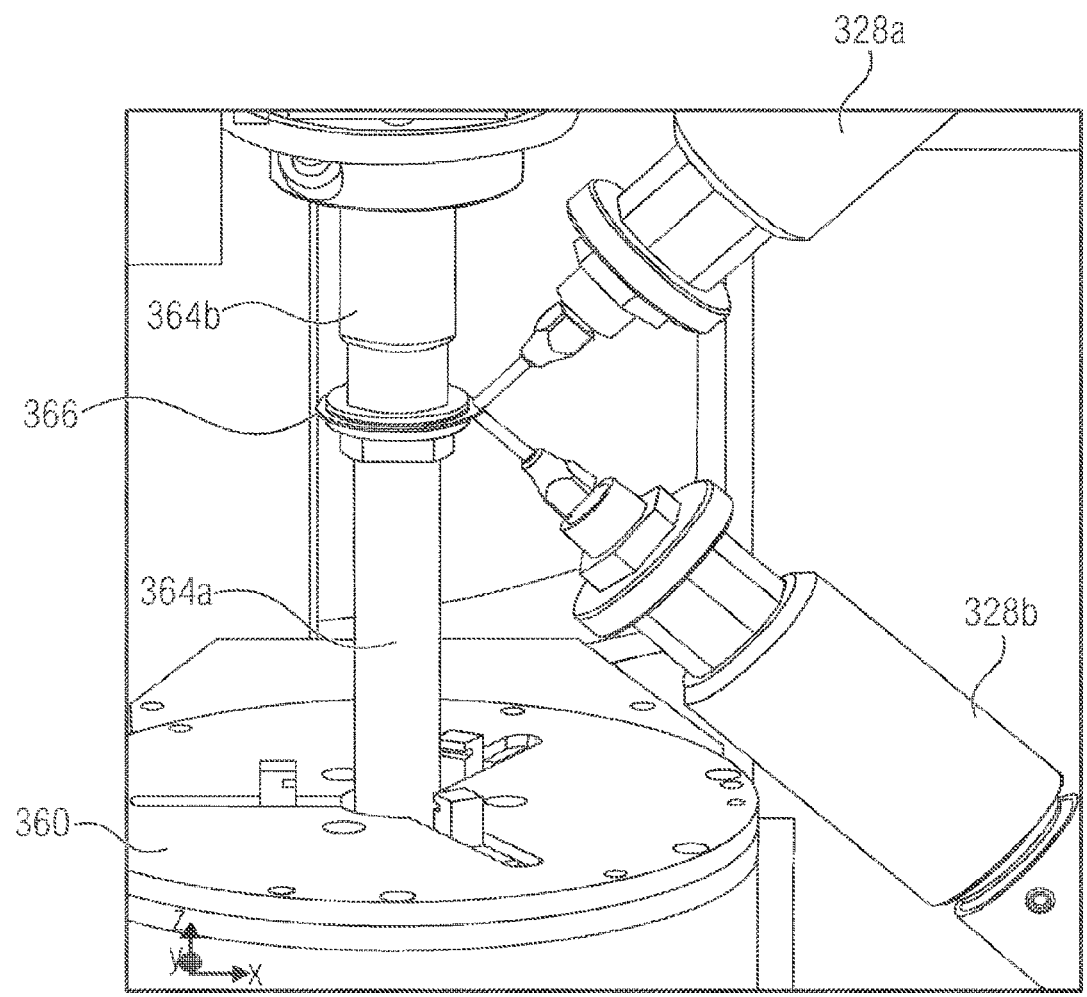
FIG. 7 is an enlarged view of the passivation station shown in FIG. 3.

FIG. 7 is an enlarged view of the passivation station shown in FIG. 3. FIG. 7 shows the upper and lower nozzle 328a and 328b for dispensing a passivation material onto the edge of the stack 366. FIG. 7 shows partly the assembly station 322b of FIG. 3. As can be seen, the stamps 364a and 364b clamp the stack 366 there between. The stamps 364a and 364b are arranged such that the stack 366 is at an elevated position above the receiving area 360 of the assembly station, wherein the distance is selected such that the stack 366 is arranged between the nozzles 328a and 328b. The stack 366 is rotated and during the rotation a passivating material is applied via the nozzles 328a and 328b from above and below so that the edge 116 of the central silicon disc 100 is covered by the passivating material.

Figure 8:
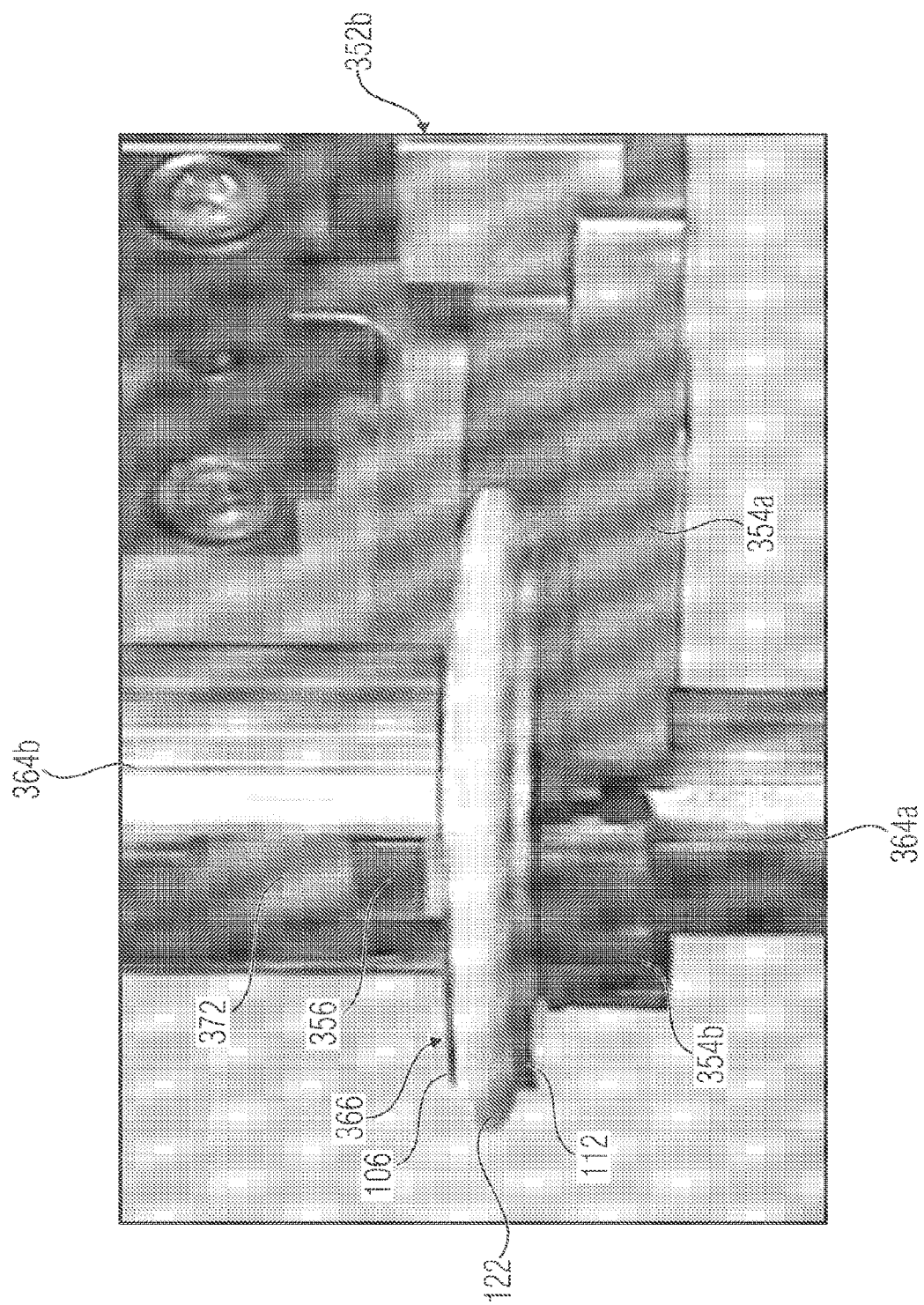
FIG. 8 is a photographic representation of a passivated stack.

FIG. 8 is a photographic representation of the stack 366 still held between the stamps 364a and 364b, however the passivation has already been completed. The passivation 122 covers the exposed portions of the silicon disc while leaving the edges of the upper 106 and lower 112 copper discs uncovered. In FIG. 8 a situation is shown where the assembly station 322b of FIG. 7 after completing the passivation process has been moved back to the position shown at reference sign 322a of FIG. 3 and the gripper arm 352b of the robot 310 already engages the stack 366. As can be seen, the lower bars 354a and 354b are placed around the lower stamp 364a whereas the upper bar 356 extends through the opening 372 in the upper stamp 364b. As soon as the gripper 352b starts applying a clamping force the clamping force applied by the stamps 364a, 364b is reduced and finally the stack 366 is released from the stamps so that it can be transported by means of the robot 310 from the assembly station towards the heating station 306.

This arrangement allows for the provision of an active clamp force of the four discs and the silicon chip at any time after assembly until the process step of preheating, thereby ensuring the correct centering of the five discs.

In the following, further details of embodiments of the fourth aspect of the invention will be described. In accordance with the fourth aspect of the invention a dynamic process control system controlling the assembly and passivation of the power disc devices is provided and embodiments thereof will now be described with reference to FIG. 9 and FIG. 10.

In accordance with embodiments of the invention, during assembly of the stack at the assembly station 322a and during the passivation process the stack 366 is monitored to ensure that the stack is correctly formed and further to ensure that a correct amount of passivation material is applied, which is within the prescribed parameters.

Figure 9A:
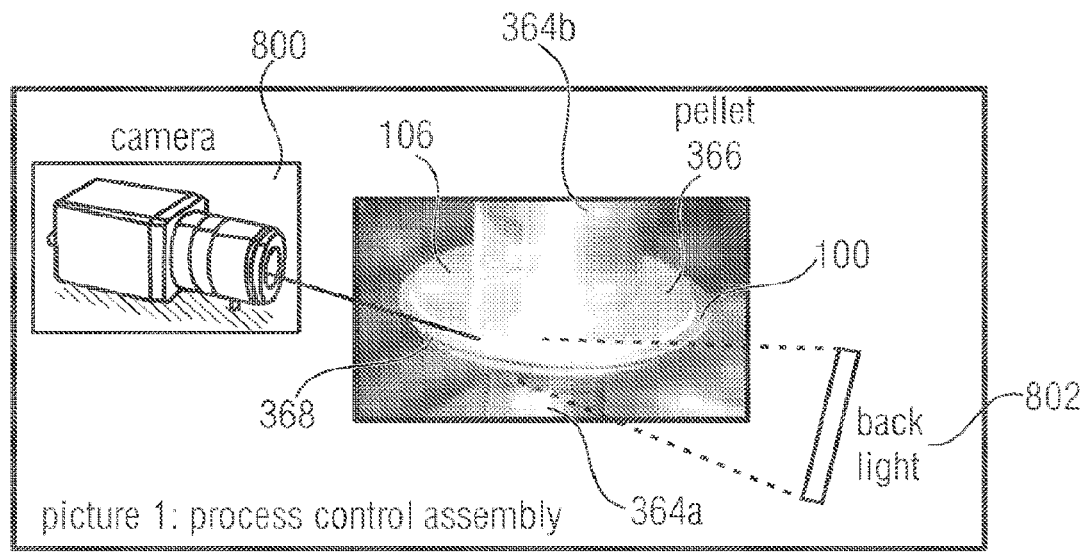
FIG. 9 shows monitoring systems, wherein FIG. 9A schematically shows a camera positioned at the assembly block, and wherein FIG. 9B schematically shows a camera positioned at the passivation station.
Figure 9B:
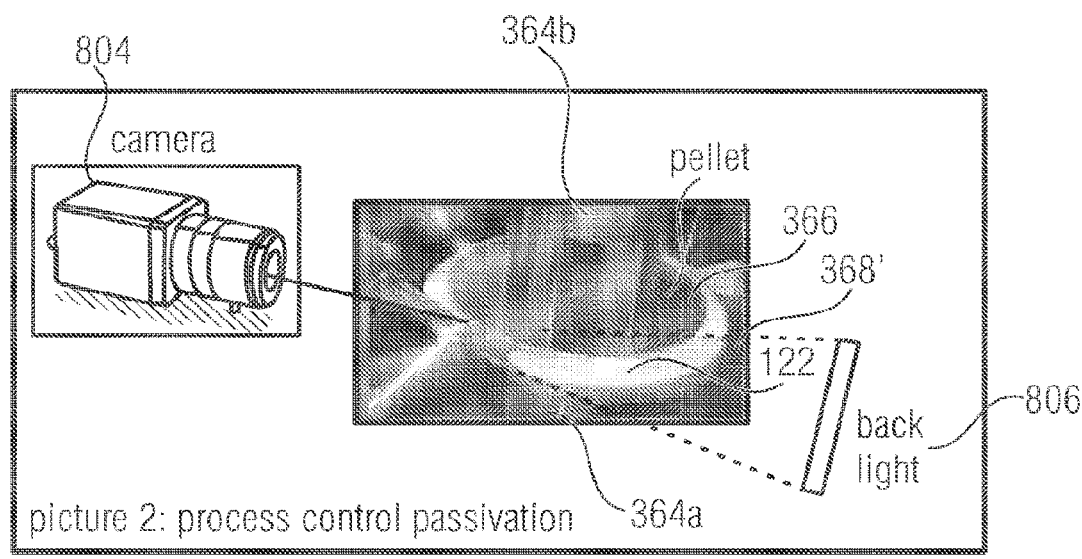

FIG. 9 shows schematically the systems associated with the assembly stations and the passivation station for monitoring the assembly and passivation process. FIG. 9A shows schematically a camera 800 positioned at the assembly block 322 to monitor the edge 368 of the pellet or stack 366 held between the upper and lower stamps 364b and 364a of the clamping device of the assembly station. The camera 800 is positioned in such a way that it "looks" into a direction tangential with respect to the edge 368 of the stack 366. The observed part of the stack is illuminated by a backlight 802 as it is schematically shown in FIG. 9A. A similar arrangement is provided at the passivation station, as is shown in FIG. 9B. Again, a camera 804 is provided to look in a direction tangential to the edge 368' of the passivated or almost passivated stack 366. Again, the spot detected by the camera 804 is illuminated by a light source providing backlight 806. The camera 800 shown in FIG. 9A monitors the edge 368 of the assembled stack 366, and the direction from which the respective pictures are taken is indicated in further detail in FIG. 10A. Upon inspection, the assembled stack is rotated and in accordance with embodiments 24 pictures are taken during one rotation. On the basis of the pictures taken the distance X1 (see FIG. 10(b)) between the outer edge 116 of the silicon disc 100 and the edges 118 of the remaining discs 104 to 112 can be obtained. In case the value X1 deviates from a preset range corrective action may be required, for example, by an operator of the device. For example, determining that the value X1 is for 24 pictures within a predefined range yields a result of the test indicating that the discs are correctly centered.

After or during the passivation process, again 24 pictures of the rotating, now passivated stack comprising the passivation layer 122 as shown in FIG. 10B are taken and the distance between the outer edge 116' now defined by the outer edge of the passivation layer 122 and the edges 118 of the remaining discs is determined. The thickness of the passivation layer 122 can also be determined. Again, in case the values are outside a preset range a warning may be issued.

Further, on the basis of the two measurements the thickness d of the passivation layer in the radial direction, i.e., the distance between the original edge 116 of the silicon disc 100 and the "new" edge 116' due to the additional passivation layer is determined to make sure that the value d is within a preset range. Dependent on the results of the measurement of the value d corrective action regarding the amount of material 122 or the position of the respective nozzles may be taken.

For both monitoring processes, in case the results of the monitoring process indicate that the parameters derived are outside the specification, the stack 366 is considered defective and may be rejected.

In the following, further details of embodiments of the fifth aspect of the invention will be described. In accordance with the fifth aspect of the invention an advanced preheating station is provided and embodiments thereof will now be described with reference to FIG. 11 and FIG. 12.

Figure 11A:
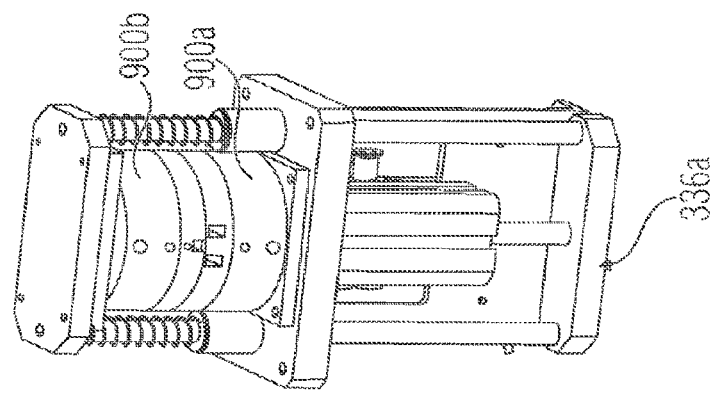
Figure 11B:
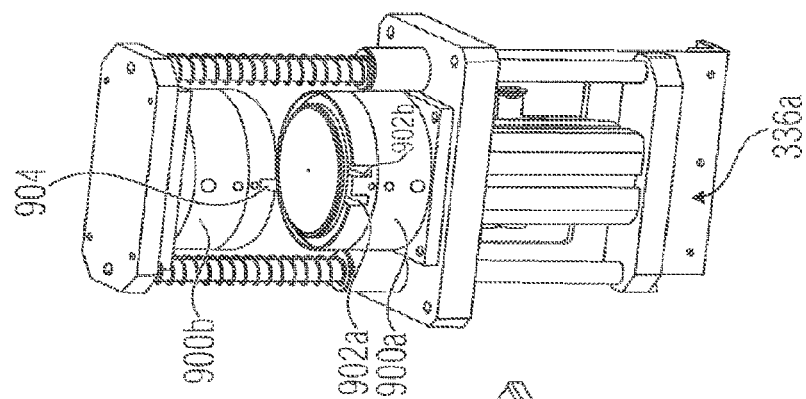
Figure 11C:
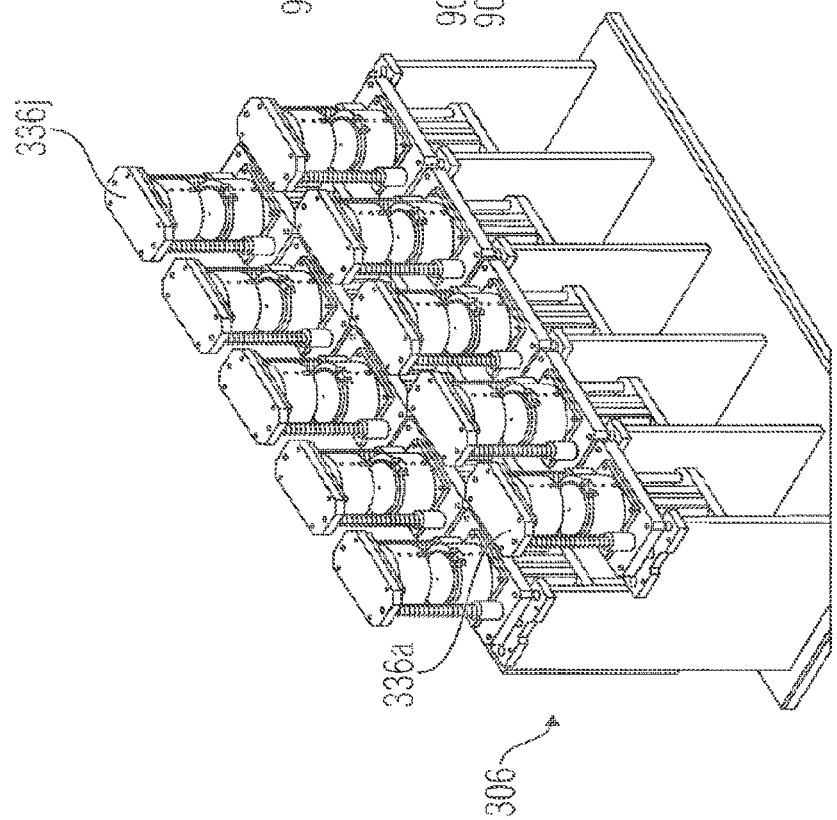
FIG. 11C shows a heating device in its closed state.

FIG. 11 shows further details of the heating station, wherein FIG. 11A shows the heating station 306 comprising the plurality of heating devices 336a to 336j. The heating devices are of identical structure and FIG. 11B shows one heating device 336a in its open state and FIG. 11C shows the heating device 336a in its closed state. The heating device comprises two heating brackets 900a and 900b that can be moved with respect to each other so as to open and close the device as shown in FIGS. 11B and 11C. In the example shown in FIG. 11 the lower bracket 900a is vertically moveable with regard to the upper bracket 900b. For placing a passivated stack into a heating device it is opened in a way as shown in FIG. 11B, and by means of the gripper the stack is placed between the two brackets 900a and 900b. The lower bracket 900a is provided with two recesses 902a and 902b for receiving the respective lower bars of the gripper 352b, and the upper bracket 900b is provided with a recess 900 for receiving the upper bar of the gripper 352b. This allows for placing the stack inside the heating device without releasing the clamp force until the two brackets 900a, 900b are closed and apply the necessary clamping force. By means of the recesses the gripper can be opened and removed from the closed heating device 336a shown in FIG. 11C. This ensures that, as mentioned above, a continuous clamp force is applied after assembly of the stack until the preheating is completed. After preheating the stack has a sufficient stability and can be easily handled without jeopardizing the centralized arrangement of the respective discs with respect to each other.

Figure 12:
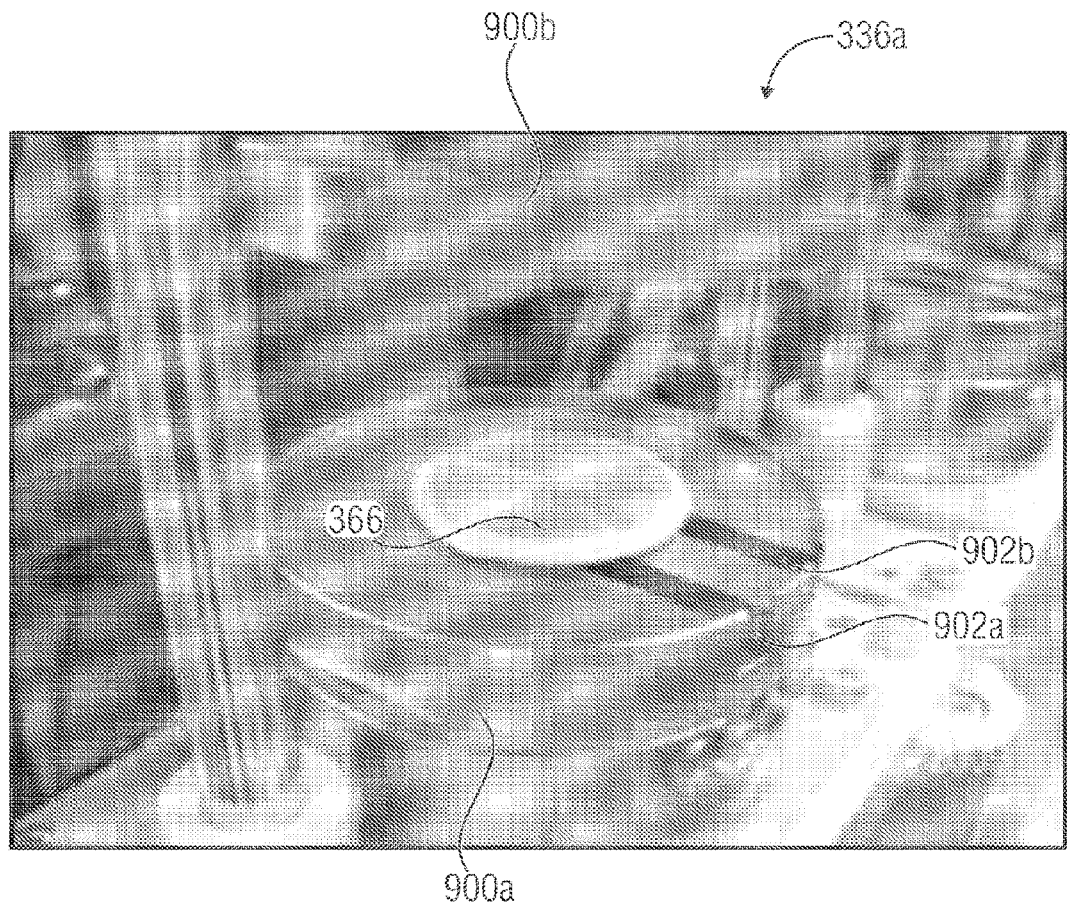
FIG. 12 shows a photographic representation of an open heating device after preheating the stack.

In accordance with embodiments the respective brackets 900a, 900b of the heating device shown in FIG. 11 are heated for applying the desired heat to the stack provided there between. The heating devices in accordance with embodiments of the invention are advantageous as when compared to a conventional oven a fast ramp-up of the temperature and an accurate and stable temperature is achieved while hardware costs are reduced and also maintenance costs can be reduced. Also, the respective elements 336a to 336j can be selectively activated so that dependent on the throughput of the system a desired number of heating devices is activated thereby avoiding unnecessary heating of devices not needed. FIG. 12 shows a photographic representation of an open heating device after preheating the stack 366. FIG. 12 shows the lower bracket 900a and the upper bracket 900b as well as the respective recesses 902a and 902b in the lower bracket 900a for receiving the lower bars of the gripper 352b. The stack 366 is now preheated and comprises a sufficient stability to be easily handled for a further processing and testing without decentralizing the layered structure.

In accordance with further embodiments single device traceability is provided by identifying the output trays as well as the reject trays by transponders. During a lot start the output tray will be automatically scanned and correlated with the recipe setting of the equipment. A cluster tool controller (CTC) (see controller 212 in FIG. 2) assures the single device traceability of any package output in reference to the test process result.

Embodiments of the invention described above with respect to the back end cluster provide a fully automated assembly technology that is visualized by a video and vision system. Two robot systems in combination with the synchronized assembly mechanism are used to assemble five discs with the accuracy of, e.g., 10 micron. The integrated dynamic process control system controls the assembly process during real time production and provides imitated feed pack of measurements within the resolution of, e.g., 2 micron.

Embodiments of the invention were described above with regard to a power disc device comprising a silicon layer sandwiched between a plurality of metal layers, more specifically sandwiched between two layers of metal layers formed of copper and molybdenum. Naturally, the inventive approach is not limited to such devices, rather it can be applied to any device in which a semiconductor device needs to be stacked with at least one additional non-semiconductor device and passivated, wherein the semiconductor device requires a semiconductor treatment before the mechanical assembly step.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A system for producing a device that include a semiconductor part and a non-semiconductor part, the system comprising:
a front end configured to receive the semiconductor part and to process the semiconductor part;
a back end configured to receive the processed semiconductor part and to assemble the processed semiconductor part and the non-semiconductor part into the device; and
a transfer device configured to automatically handle the semiconductor part in the front end and to automatically transfer the processed semiconductor part to the back end.

2. The system of claim 1, wherein the transfer device comprises a robot having an arm provided with a gripper configured to grip the semiconductor part.

3. The system of claim 1, wherein the front end comprises an etching station and a test station, and wherein the transfer device is configured to insert/remove a semiconductor part into/from a respective station.

4. The system of claim 3, wherein the back end comprises an intermediate tray configured to receive a processed semiconductor part, and wherein the transfer device is configured to transfer the semiconductor part from an input of the front end to the etching station, from the etching station to the test station, and from the test station to the intermediate tray of the back end in case the processed semiconductor part passed the test, to a reject bin in case the processed semiconductor part did not pass the test, or back into the etch station in case the test indicates that additional etching is required.

5. The system of claim 1, wherein the back end comprises an assembly station configured to assemble the processed semiconductor part and the non-semiconductor part into an assembled stack.

6. The system of claim 5, wherein the assembly station is configured to receive one or more non-semiconductor parts and the processed semiconductor part for forming the assembled stack, and wherein the assembly station comprises:
a centering device configured to center the non-semiconductor parts of the assembled stack; and
a clamping device configured to apply a clamp force to a top and a bottom of the assembled stack.

7. The system of claim 6, wherein the centering device comprises a plurality of centering elements arranged at different positions around a receiving area of the assembly station, wherein each of the centering elements is moveable in a vertical direction and in a radial direction, and wherein the assembly station is configured to form the assembled stack by:
receiving at least one first non-semiconductor part;
moving the centering elements radially inward for centering the first non-semiconductor part;
receiving the processed semiconductor part on the first non-semiconductor part, wherein a diameter of the processed semiconductor part is larger than the diameter of the first non-semiconductor part;
receiving at least one second non-semiconductor part on the processed semiconductor part;
moving the centering elements radially outward and vertically so as to allow the centering elements to pass the processed semiconductor part, and radially inward after having passed the processed semiconductor part for centering the second non-semiconductor part; and
activating the clamping device for applying the clamp force to the stack.

8. The system of claim 7, wherein the clamping device is configured to raise the stack to a position elevated with respect to the receiving area, while maintaining the clamp force.

9. The system of claim 7, wherein the back end comprises a transfer device and a position detecting device configured to detect a position of a processed semiconductor part held by the transfer device with respect to the transfer device, and wherein the transfer device is configured to be controlled on a basis of the detected position for placing the processed semiconductor part centered on the first non-semiconductor part.

10. The system of claim 9, wherein the clamping device comprises a lower stamp and an upper stamp that are vertically moveable for an engagement with the assembled stack and for application of the clamp force, wherein the transfer device comprises a gripper configured to hold the processed semiconductor part for placement in the assembly station and to hold the assembled stack while applying the clamp force, and wherein the clamping device and the transfer device are configured such that the clamping device releases the clamp force only once the gripper of the transfer device engaged the assembled stack and applied the clamp force to the assembled stack so as to ensure a continuous application of the clamp force to the assembled stack.

11. The system of claim 7, further comprising a first monitoring device configured to optically monitor an edge of the assembled stack to determine along a periphery at predefined intervals a first distance between an outer edge of the processed semiconductor part and an outer edge of the first and second non-semiconductor parts.

12. The system of claim 1, further comprising a passivation station, wherein the passivation station comprises a nozzle device configured to apply a passivation material to an edge of a stack of assembled parts such that the edge of the processed semiconductor part is covered with the passivation material.

13. The system of claim 12, wherein the nozzle device comprises a top nozzle and a bottom nozzle for applying the passivation material.

14. The system of claim 12, further comprising
a first monitoring device configured to optically monitor the edge of the stack of assembled parts to determine along a periphery at predefined intervals a first distance between an outer edge of the processed semiconductor part and an outer edge of first and second non-semiconductor parts, and
a second monitoring device configured to optically monitor an edge of the stack of assembled parts to which the passivation material was applied to determine at a plurality of predefined intervals a second distance between an outer edge of the passivation material on the processed semiconductor part and an outer edge of the first and second non-semiconductors, wherein the system is configured to determine on a basis of the first and second distances a thickness of the passivation material in a radial direction provided on the edge of the processed semiconductor part.

15. The system of claim 14, wherein the nozzle device is arranged radially moveable with regard to the edge of the stack of assembled parts, and wherein the nozzle device is configured to be controlled with respect to its position and/or amount of the passivation material dispensed on a basis of the determined thickness.

16. The system of claim 1, further comprising a heating station, wherein the heating station comprises a pair of heating brackets configured to be moveable with respect to each other and to receive a stack of assembled and passivated parts there between.

17. The system of claim 16, wherein the heating brackets are configured such that a gripper of a transfer device placing the stack there between releases the stack only once the heating brackets were closed and apply a clamp force so as to ensure a continuous application of the clamp force to the stack.

18. The system of claim 16, comprising a plurality of heating stations configured to be selectively activated dependent on a number of stacks produced.

19. The system of claim 1, wherein the device to be assembled comprises a power disc device including a semiconductor chip sandwiched between a plurality of metal discs, wherein the semiconductor chip has a larger diameter than the metal discs and an etched edge.

20. The system of claim 19, wherein the semiconductor chip is placed between a first pair of metal discs and a second pair of metal discs, the first and second pairs each including a copper disc and a molybdenum disc.

21. A system for producing a device including a semiconductor part and a non-semiconductor part, the system comprising:
- a front end configured to receive the semiconductor part and to process the semiconductor part;
- a back end configured to receive the processed semiconductor part and the non-semiconductor part and to assemble the processed semiconductor part and the non-semiconductor part into the device; and
- means for automatically handling the semiconductor part in the front end and for automatically transferring the processed semiconductor part to the back end.

22. A method for producing a device including a semiconductor part and a non-semiconductor part, the method comprising:
- receiving and processing a semiconductor part at a front end processing station;
- automatically handling the semiconductor part in the front end processing station and automatically transferring the processed semiconductor part to a back end processing station; and
- receiving and assembling the processed semiconductor part and the non-semiconductor part at the back end processing station.

* * * * *